United States Patent
Jung et al.

(10) Patent No.: US 8,383,475 B2
(45) Date of Patent: *Feb. 26, 2013

(54) EEPROM CELL

(75) Inventors: Sung Mun Jung, Singapore (SG); Kian Hong Lim, Singapore (SG); Jianbo Yang, Singapore (SG); Swee Tuck Woo, Singapore (SG); Sanford Chu, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 152 days.

This patent is subject to a terminal disclaimer.

(21) Appl. No.: 12/888,431

(22) Filed: Sep. 23, 2010

(65) Prior Publication Data

US 2012/0074482 A1     Mar. 29, 2012

(51) Int. Cl.
*H01L 21/8238*     (2006.01)
(52) U.S. Cl. . 438/201; 438/211; 438/257; 257/E21.179; 257/E21.422
(58) Field of Classification Search .................. 257/314, 257/315, 316, 317, 321, E29.129, E29.3, 257/E21.179, E21.422, E21.68; 438/201, 438/211, 257, 263, 264, 593, 594
See application file for complete search history.

(56) References Cited

U.S. PATENT DOCUMENTS

| 5,886,376 | A | 3/1999 | Acovic et al. | |
|---|---|---|---|---|
| 6,373,095 | B1 | 4/2002 | Bracchitta et al. | |
| 7,704,832 | B2 | 4/2010 | Kai et al. | |
| 2012/0074482 | A1 * | 3/2012 | Jung et al. | 257/316 |

FOREIGN PATENT DOCUMENTS

| DE | 69018374 T2 | 11/1995 |
|---|---|---|
| DE | 19748910 C2 | 6/2001 |
| DE | 69330401 T2 | 6/2002 |
| DE | 69333359 T2 | 10/2004 |

* cited by examiner

*Primary Examiner* — Hoai V Pham
(74) *Attorney, Agent, or Firm* — Horizon IP Pte. Ltd.

(57) ABSTRACT

A method of forming a device is disclosed. The method includes providing a substrate prepared with a cell area separated by other active areas by isolation regions. First and second gates of first and second transistors in the cell area are formed. The first gate includes first and second sub-gates separated by a first intergate dielectric layer. The second gate includes a second sub-gate surrounding a first sub-gate. The first and second sub-gates of the second gate are separated by a second intergate dielectric layer. First and second junctions of the first and second transistors are formed. The method also includes forming a first gate terminal coupled to the second sub-gate of the first transistor and a second gate terminal coupled to at least the first sub-gate of the second transistor.

25 Claims, 12 Drawing Sheets

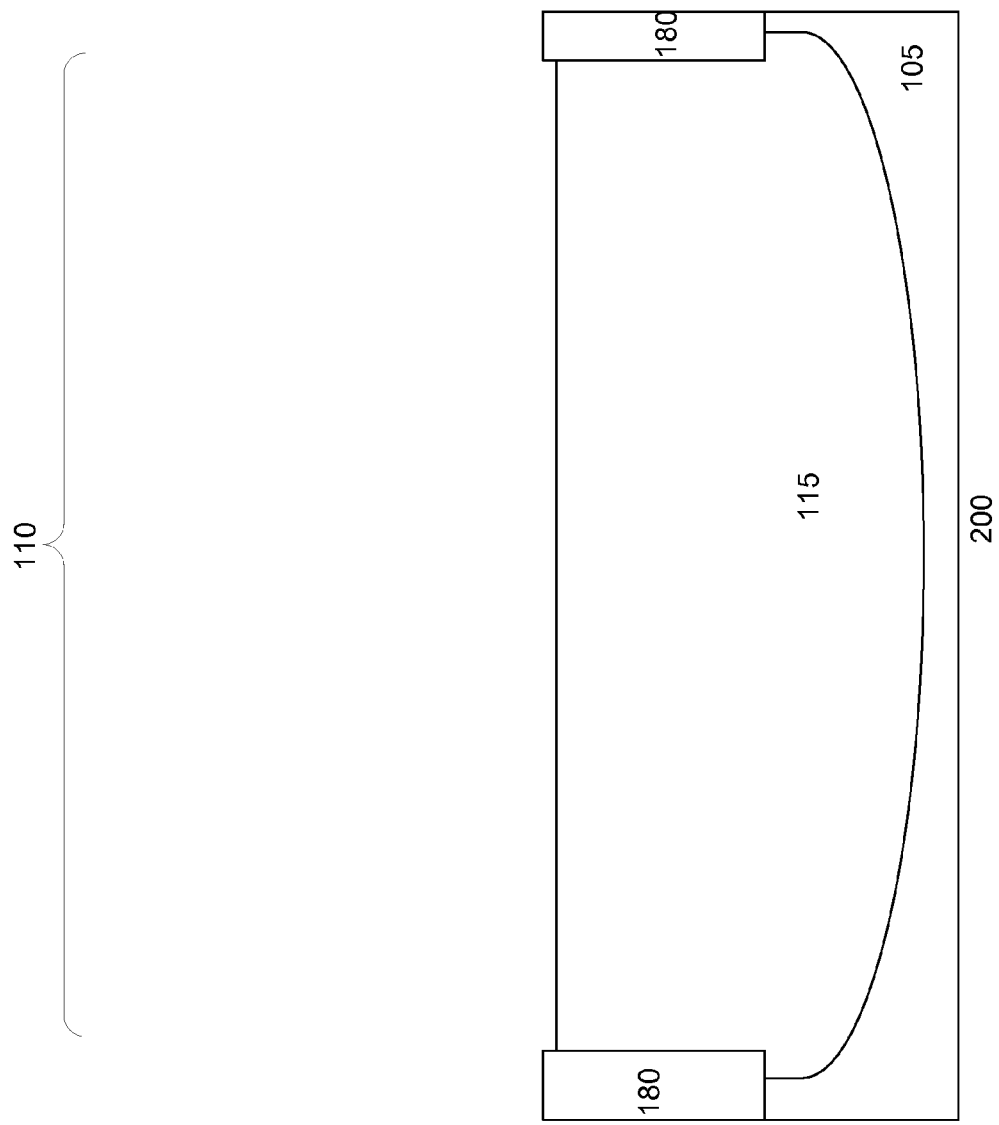

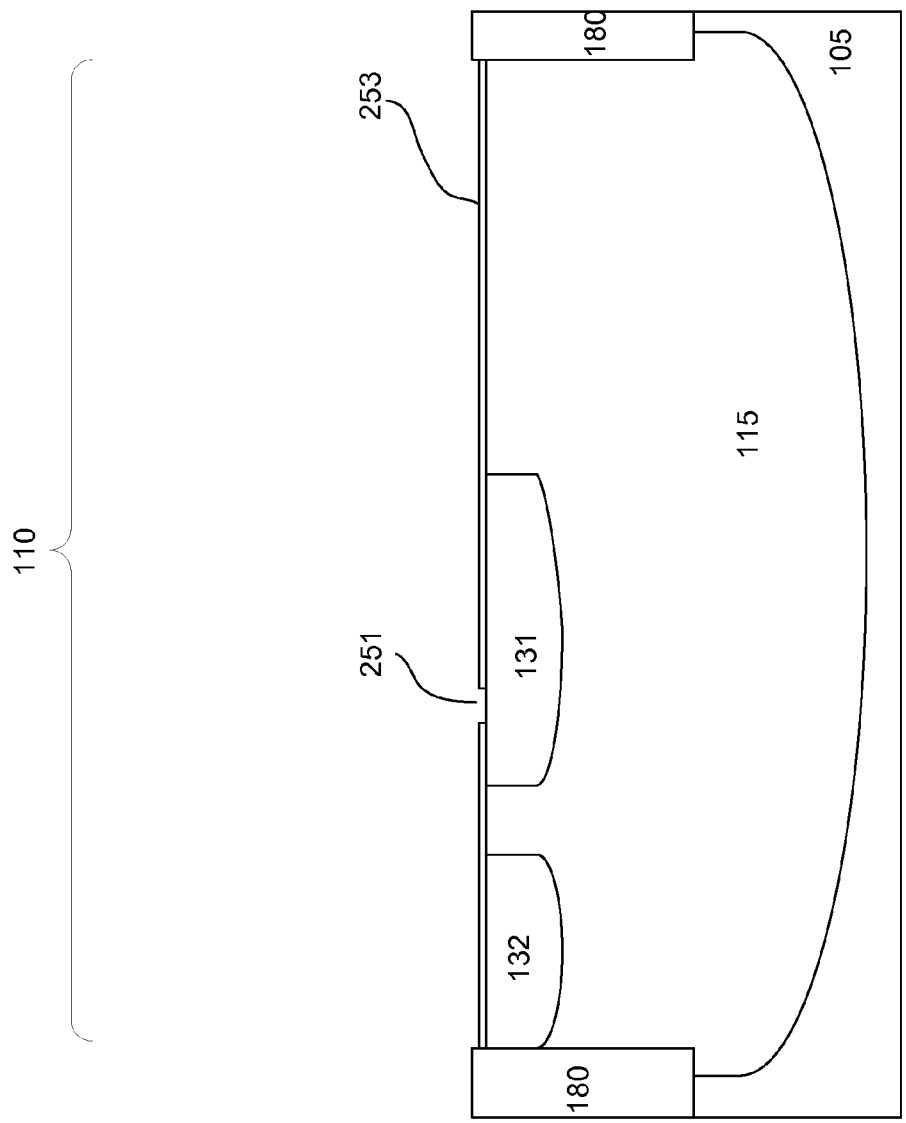

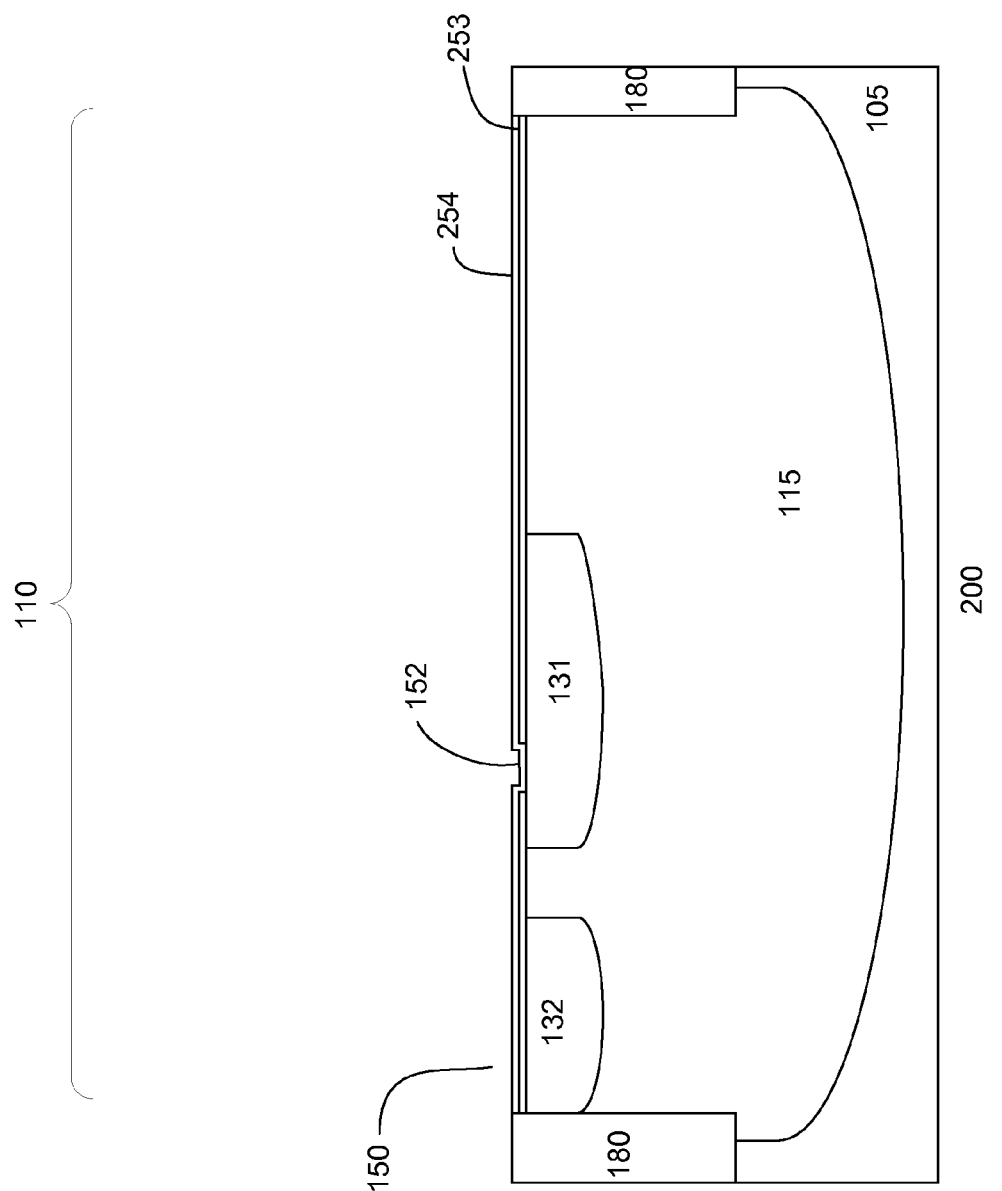

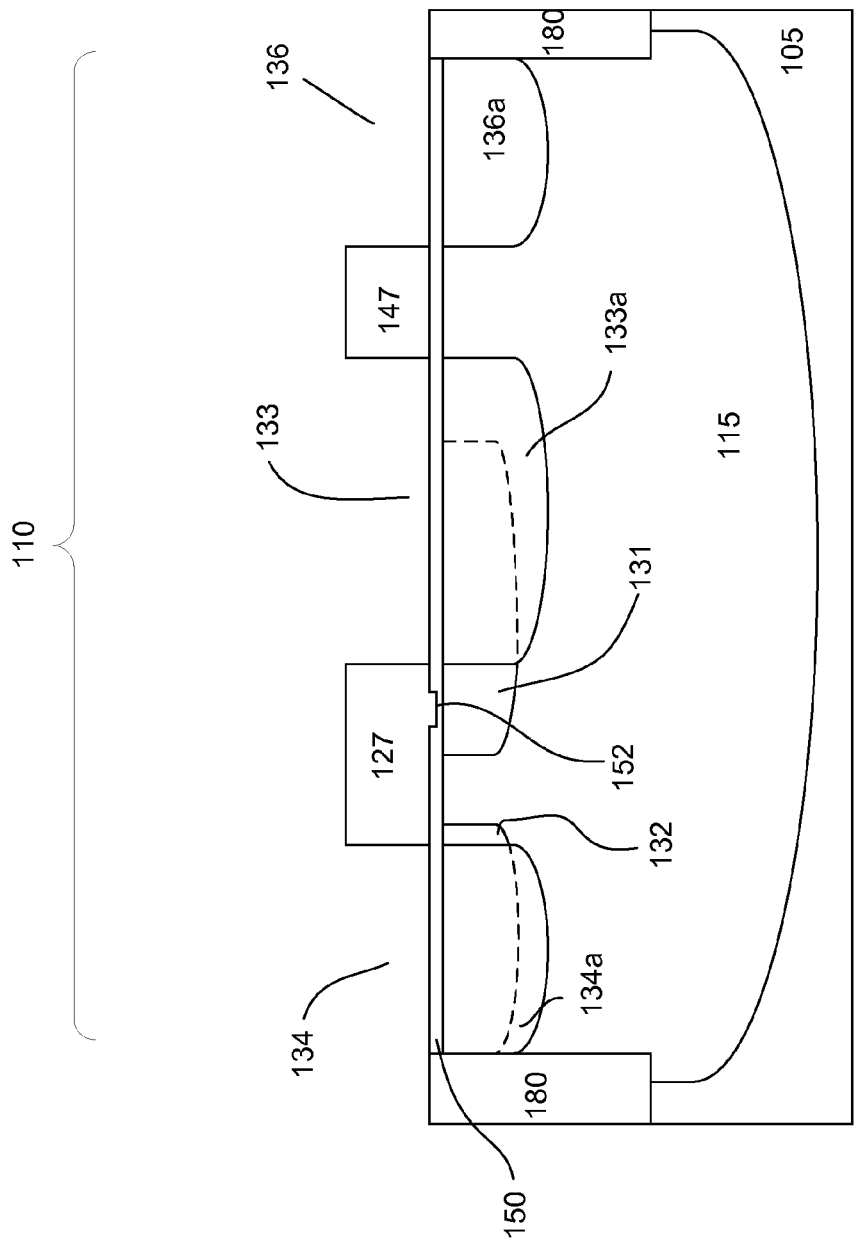

EEPROM CELL

CROSS-REFERENCE

This application is concurrently filed with U.S. patent application Ser. No. 12/888,434 entitled "Dielectric Stack"; filed Sep. 23, 2010), and U.S. patent application Ser. No. 12/888,437 entitled "EEPROM Cell"; filed Sep. 23, 2010), which are herein incorporated by reference for all purposes.

BACKGROUND

Non-volatile memory (NVM) circuits, such as electrically erasable programmable read-only memory (EEPROM) circuits have achieved widespread adoptions for code and data storage applications. An important aspect of NVM circuits is their performance, which includes endurance (number of programming or write/erase cycles) and data retention after write/erase cycling. Within the industry, the performance of NVM technology has been characterized extensively. Generally, the NVM circuits should be able to endure over 100 thousand to 1 million programming cycles with data retention exceeding 20 years, even at extreme ambient temperatures.

Memory operations, such as programming and erasing, may involve, for example, charging or discharging electrons from a floating gate of a NVM cell. The charging and discharging of electrons may be achieved by hot carrier injection (HCI) or Fowler-Nordheim (FN) tunneling. High voltages are used to perform certain memory operations. However, high voltages can cause junction breakdown or degradation.

It is desirable to provide memory cells with improved reliability even when exposed to high voltages.

SUMMARY

A method of forming a device is disclosed. The method includes providing a substrate prepared with a cell area separated by other active areas by isolation regions. First and second gates of first and second transistors in the cell area are formed. The first gate includes first and second sub-gates separated by a first intergate dielectric layer. The second gate includes a second sub-gate surrounding a first sub-gate. The first and second sub-gates of the second gate are separated by a second intergate dielectric layer. First and second junctions of the first and second transistors are formed. The method also includes forming a first gate terminal coupled to the second sub-gate of the first transistor and a second gate terminal coupled to at least the first sub-gate of the second transistor.

A device is also presented. The device includes a cell having first and second transistors coupled in series. The first and second transistors are disposed between first and second cell terminals. The first transistor includes a first gate with first and second sub-gates separated by a first intergate dielectric layer. The second transistor includes a second gate with first and second sub-gates separated by a second intergate dielectric layer. The second sub-gate of the second transistor surrounds the first sub-gate of the second transistor. A first gate terminal is coupled to the second sub-gate of the first gate. A second gate terminal is coupled to at least the first sub-gate of the second gate.

In another embodiment, a device is also disclosed. The device includes a cell having first and second transistors. The first transistor includes a first gate between first and second junctions of the first transistor. The first gate includes first and second sub-gates of the first gate, a first intergate dielectric layer separating the first and second sub-gates of the first gate, and a first gate dielectric layer separating the first sub-gate of the first gate from the substrate. The second transistor includes a second gate between first and second junctions of the second transistor. The second gate includes first and second sub-gates of the second gate. The second sub-gate surrounds the first sub-gate of the second transistor. The second gate also includes a second intergate dielectric layer separating the first and second sub-gates of the second gate and a second gate dielectric layer separating the first sub-gate of the second gate from the substrate. The second junctions of the first and second transistors are coupled. The device also includes a first cell terminal coupled to the first junction of the first transistor, a second cell terminal coupled to the first junction of the second transistor, a first gate terminal coupled to the second sub-gate of the first transistor and a second gate terminal coupled to at least the first sub-gate of the second transistor.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-h show cross-sectional views of a process of forming an embodiment of a memory cell.

DETAILED DESCRIPTION

Embodiments generally relate to semiconductor devices. More particularly, some embodiments relate to memory devices, such as non-volatile memory devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, such as computers, cell phones, and personal digital assistants (PDAs).

Figure 1A:
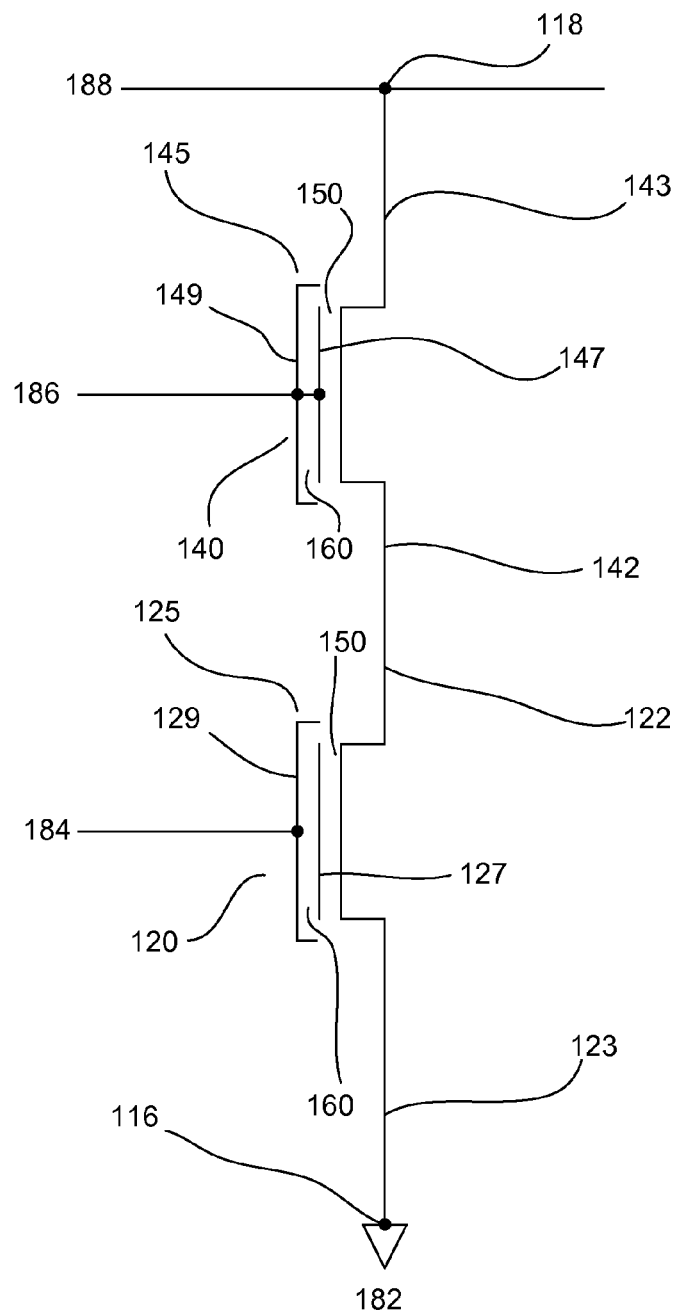
FIG. 1a shows a schematic diagram of an embodiment of a memory cell.

FIG. 1a shows a schematic diagram of an embodiment of a memory cell 100. The memory cell may comprise a non-volatile memory cell. For example, the memory cell may be an electrically erasable programmable read-only memory (EEPROM). In one embodiment, the memory cell comprises a floating gate tunnel oxide (FLOTOX) EEPROM cell. Other types of memory cells may also be useful.

The memory cell, in one embodiment, comprises a first transistor 120 and a second transistor 140. The first transistor comprises a first gate 125 between first and second transistor terminals 122 and 123. The first gate includes a second sub-gate 129 surrounding a first sub-gate 127. The sub-gates are separated by an intergate dielectric layer 160. A gate dielectric layer 150 separates the first gate from the channel of the first transistor. As for the second transistor, it comprises a second gate 145 between first and second transistor terminals 142 and 143. The second gate includes a second sub-gate 149 surrounding a first sub-gate 147. The sub-gates are separated by an intergate dielectric layer 160. A gate dielectric layer 150 separates the second gate from the channel of the second transistor.

In one embodiment, the transistors are configured in series between first and second cell terminals 116 and 118. For example, the first terminals of the first and second transistors are commonly coupled while the second terminal of the first transistor is coupled to the first cell terminal and the second terminal of the second transistor is coupled to the second cell terminal. Furthermore, first and second gate terminals 184 and 186 are respectively coupled to first and second gates of the first and second transistors. One of the first and second gate terminals is coupled to at least the first sub-gate of the gate and the other of the first and second gate terminals is coupled to the second sub-gate of the gate. In one embodiment, one of the first and second gate terminals is coupled to both the first and second sub-gates of the gate. In one embodiment, the other of the first and second gate terminals is coupled to the second sub-gate and not the first sub-gate.

In accordance with one embodiment, the first gate serves as a control or floating gate and the second gate serves as a select gate of the memory cell. The first gate terminal is coupled to the second sub-gate of the first transistor and is coupled to a control gate line. The second gate terminal is coupled to the first and second sub-gates of the second transistor and is coupled to a word line. The first cell terminal is coupled to a first potential 182 and the second cell terminal is coupled to a bitline 188. In one embodiment, the first potential is equal to ground. For example, the first potential may be the array ground. In other embodiments, the coupling of the terminals may be arranged in other configurations.

Figure 1B:
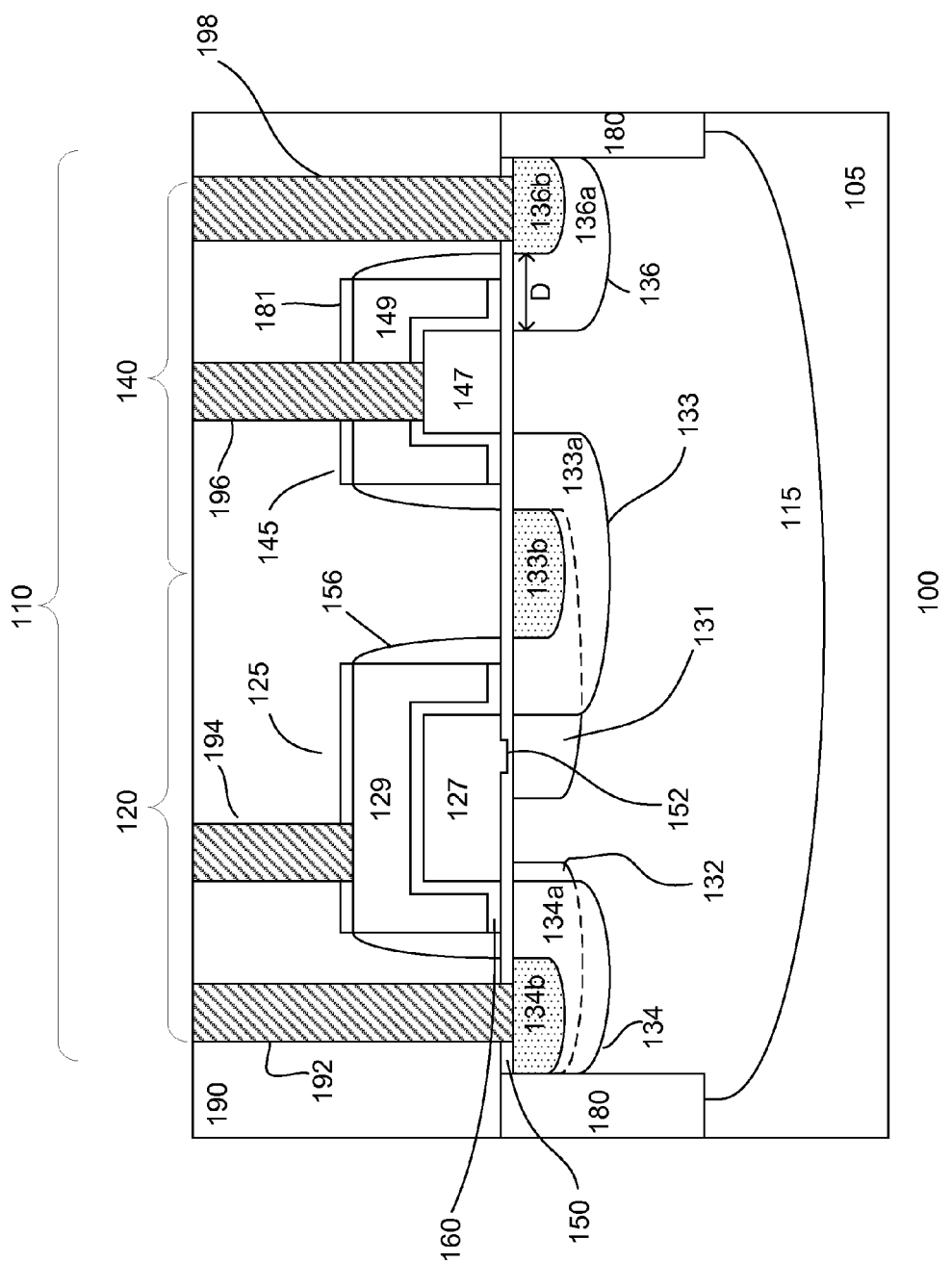
FIGS. 1b-c show cross-sectional views of embodiments of a memory cell.

FIG. 1b shows a cross-sectional view of an embodiment of a memory cell 100 as shown in FIG. 1a. There is shown a substrate 105 which includes a cell region 110. The cell region is isolated from other regions by isolation regions 180. The isolation regions, for example, are shallow trench isolation (STI) regions. Other types of isolation regions may also be employed. The cell region, in one embodiment, includes a doped well 115. The doped well comprises dopants of a second polarity type.

First and second transistors 120 and 140 are disposed in the cell region. In one embodiment, the first transistor serves as a control gate. The first transistor includes a first gate 125 disposed on the substrate. The first gate, in one embodiment, includes first and second sub-gates 127 and 129. The sub-gates comprise, for example, polysilicon. Forming sub-gates using other types of gate electrode materials, such as metals or metal-silicon compounds like metal silicides, may also be useful. It is understood that the first and second sub-gates need not be formed from the same material. In one embodiment, the second sub-gate surrounds the first sub-gate.

An intergate dielectric layer 160 separates the first and second sub-gates. The intergate dielectric layer, for example, may comprise a dielectric stack having multiple dielectric layers. For example, the dielectric stack may comprise an oxide-nitride-oxide (ONO) stack. ONO stacks, for example, are described in concurrently filed U.S. patent application Ser. No. 12/888,434, titled "Dielectric Stack"; filed Sep. 23, 2010), which is herein incorporated by reference for all purposes. Other types of intergate dielectric layers or stacks may also be used. For example, the intergate dielectric layer may comprise $SiO_2$ or a three-layer stack with one of the layers comprising $HfO_x$ or $Al_2O_3$. Separating the bottom of the first gate from the substrate is a gate dielectric layer 150. In one embodiment, the gate dielectric layer comprises thermal silicon oxide. The gate dielectric layer may comprise two or more gate dielectric layers. Other types of gate dielectric layers may also be used.

Dielectric spacers 156 may be optionally provided on sidewalls of the first gate. For example, the spacers may be provided on sidewalls of the second sub-gate. The spacers may comprise silicon nitride. Other types of spacers may also be employed. For example, the spacers may include multiple spacers. A dielectric etch stop layer 181 may be provided on the surface of the second sub-gate. The etch stop layer may comprise silicon nitride. Other types of etch stop materials may also be used to form the etch stop layer.

First and second doped regions 133 and 134 are provided adjacent to the first gate. The first and second doped regions comprise dopants of a first polarity type, which is the opposite of the second polarity type. The first and second doped regions form source/drain (S/D) diffusion regions of the first transistor. In one embodiment, the first and second doped regions include first and second sub-portions 133a-b and 134a-b. The first sub-portions 133a and 134a are lightly doped portions (e.g., $x^-$, where x may be the polarity type of dopants such as p or n) and the second sub-portions are heavily doped portions (e.g., $x^+$). The lightly doped portions, for example, comprise lightly doped drains (LDDs) or double diffused drains (DDDs). In one embodiment, the lightly doped portions comprise DDDs. The DDDs, for example, comprise a depth greater than the second sub-portions. For example, a second sub-portion is encompassed within a DDD. In one embodiment, the first sub-portions extend beneath the second sub-gate to the first sub-gate. As shown, inner edges of the first sub-portions of the doped regions are about aligned with sidewalls of the first sub-gate. The second sub-portions are about aligned with the outer edge of the spacers. In embodiments without spacers, the second sub-portions are about aligned with the sidewalls of the second sub-gate. Other configurations of the doped regions may also be useful.

In one embodiment, first and second buried doped regions 131 and 132 are provided in the first transistor region. The buried doped regions comprise dopants of the first polarity type. The buried doped regions comprise an intermediate dopant concentration (e.g., x) of the first polarity type dopants. The intermediate dopant concentration, in one embodiment, is between the dopant concentrations of the lightly and heavily doped portions (e.g., $x^- \leq x \leq x^+$). Providing other dopant concentrations for the buried doped regions may also be useful. The buried doped regions are provided adjacent to the first gate. In one embodiment, the buried doped regions overlap with the first and second doped regions and extend beneath the first gate. In one embodiment, one of the buried doped regions extends beneath a tunneling window 152 in the gate dielectric layer. In one embodiment, one of the buried doped regions extends beneath the first gate beyond the tunneling window in the gate dielectric layer. For example, the first buried doped region extends beneath the first gate beyond the tunneling window in the gate dielectric layer. The buried doped regions provide charge carriers for the first sub-gate through the tunneling window. The buried doped regions also determine the effective channel length of the first sub-gate as well as the source resistance of the cell.

In one embodiment, the implantation dosage of the buried doped regions is about $E14\ cm^{-2}$, the implantation dosage of the lightly doped regions, such as LDDs or DDDs, is about $E13\ cm^{-2}$, and the implantation dosage of the heavily doped regions is about E15 cm$^{-2}$. Providing the different doped regions with other dopant concentrations may also be useful.

As for the second transistor, it serves as a select gate. The second transistor includes a second gate 145 disposed on the substrate. The second gate includes first and second sub-gates 147 and 149. The sub-gates comprise, for example, polysilicon. Forming sub-gates using other types of gate electrode materials, such as metals or metal-silicon compounds like metal silicides may also be useful. It is understood that the first and second sub-gates need not be formed from the same material. In accordance with one embodiment, the second sub-gate surrounds the first sub-gate.

An intergate dielectric layer 160 separates the first and second sub-gates. The intergate dielectric layer, for example, may comprise a dielectric stack, such as an oxide-nitride-oxide (ONO) stack. Other types of intergate dielectric layers may also be used. For example, the intergate dielectric layer may comprise $SiO_2$ or a three-layer stack with one of the layers comprising $HfO_x$ or $Al_2O_3$. Separating the bottom of the first gate from the substrate is a gate dielectric layer 150. In one embodiment, the gate dielectric layer comprises thermal silicon oxide. The gate dielectric layer may comprise two or more gate dielectric layers. Other types of gate dielectric layers may also be used.

Dielectric spacers 156 may be optionally provided on sidewalls of the second gate. For example, the spacers may be provided on sidewalls of the second sub-gate. The spacers may comprise silicon nitride. Other types of spacers may also be employed. For example, the spacers may include multiple spacers. A dielectric etch stop layer 181 may be provided on the surface of the second sub-gate. The etch stop layer may comprise silicon nitride. Other types of etch stop materials may also be used to form the etch stop layer.

First and second doped regions 133 and 136 are provided adjacent to the second gate. The first and second doped regions comprise dopants of the first polarity type. The first and second doped regions form S/D diffusion regions of the second transistor. The first doped region, for example, is the first doped region which is common to both the first and second transistors. In one embodiment, the first and second doped regions include first and second sub-portions 133a-b and 136a-b. The first sub-portions 133a and 136a are lightly doped portions and the second sub-portions are heavily doped portions. The lightly doped portions, for example, comprise LDDs or DDDs. In one embodiment, the lightly doped portions comprise DDDs. The DDDs, as shown, comprise a depth greater than the second sub-portions. For example, a second sub-portion is encompassed within a DDD. In one embodiment, the first sub-portions extend beneath the second sub-gate to the first sub-gate. As shown, inner edges of the first sub-portions of the doped regions are about aligned with sidewalls of the first sub-gate. The second sub-portions are about aligned with the outer edge of the spacers. In embodiments without spacers, the second sub-portions are about aligned with the sidewalls of the second sub-gate. Other configurations of the doped regions may also be useful.

In one embodiment, the second diffusion region of the first transistor serves as the first cell terminal and the second diffusion region of the second transistor serves as the second cell terminal of the memory cell. The gate of the first transistor serves as the first gate terminal and the gate of the second transistor serves as the second gate terminal of the memory cell.

An interlevel dielectric (ILD) layer 190 may be provided on the substrate covering the transistor. The interlevel dielectric layer may serve as a premetal dielectric (PMD) layer. Various materials may be used to form the PMD layer, for example, BPSG, PSG, HDP oxide, HARP, TEOS or a combination thereof. Other materials may also be useful.

Contacts are formed in the PMD layer to provide connections to the different terminals of the memory cell. The contacts, for example, comprise a conductive material such as tungsten. Other types of conductive materials may also be employed. A contact may include a contact liner. Various types of contact liners may be used. For example, the contact liner may be titanium (Ti), titanium nitride TiN or a combination thereof. In some embodiments, the liner comprises a composite liner comprising a combination of Ti and TiN, such as Ti/TiN or Ti/TiN/Ti. Other types of liners may also be employed.

In one embodiment, first and second contacts 192 and 198 are provided in the PMD layer to couple to first and second cell terminals. The first terminal is coupled to ground and the second terminal is coupled to a bitline. Third and fourth contacts 194 and 196 are provided in the PMD layer to couple to first and second gate terminals. In one embodiment, the third contact is coupled to the second sub-gate of the first transistor and the fourth contact is coupled to the first and second sub-gates of the second transistor. The first gate terminal is coupled to a control gate line and the second gate terminal is coupled to a wordline.

Table 1 shows an exemplary embodiment of bias conditions of the different terminals for different operations of the memory cell. Operating the memory cell using other bias conditions may also be useful.

TABLE 1

| terminals | operations | | |
|---|---|---|---|
| | Erase | Write | Read |
| First cell terminal (array ground) | 0 V | Float | 0 V |
| Second cell terminal (bitline) | Float | 10~15 V | 0.5 V~1.5 V |
| First gate terminal (control gate) | 12~17 V | 0 V | 0~3 V |
| Second gate terminal (wordline) | 12~19 V | 12~19 V | 2~4 V |
| Substrate | 0 V | 0 V | 0 V |

As can be seen, the cell gate terminal (bitline) experiences high voltages during write operations. Exposure to such high voltages may cause junction breakdown or junction degradation in the second (select) transistor. For example, high leakage from the second doped region 136a-b to the doped well 115 may occur. This decreases the reliability of the gate dielectric layer of the second transistor.

In one embodiment, the distance D between the second sub-portion 136b of the second doped region 136 in the second transistor and the channel, which is the inner edge of the first doped sub-portion 136a of the second doped region 136, is increased to improve junction breakdown performance. For example, the breakdown voltage of the junction is increased. This decreases leakage current at the junction. As such, increasing junction breakdown voltage improves reliability of the junction.

In one embodiment, the distance D is determined by the width of the portion of the second sub-gate which surrounds the first sub-gate. For example, D can be determined by patterning the second gate layer such that it overlaps the first patterned first gate by the desired distance D. The distance D, for example, may be about 0.1-0.2 µm. Providing other values of D may also be useful. The value of D can be selected to achieve the desired breakdown voltage. For example, the breakdown voltage can be increased from about 14 V with a D of 0 to about 17 V with a D of about 0.2 µm. This is about a 20% increase in breakdown voltage, which results in improved reliability of the second transistor or select transistor.

A plurality of memory cells can be arranged to form a memory array. For example, the plurality of memory cells may be arranged in rows and columns. The memory cells, for example, comprise memory cells 100 as described in FIGS. 1*a-b*. A row corresponds to, for example, a wordline (WL) and a column corresponds to a bitline (BL) of the array. Control gate lines are also provided to couple to the control gate terminal.

Figure 1C:
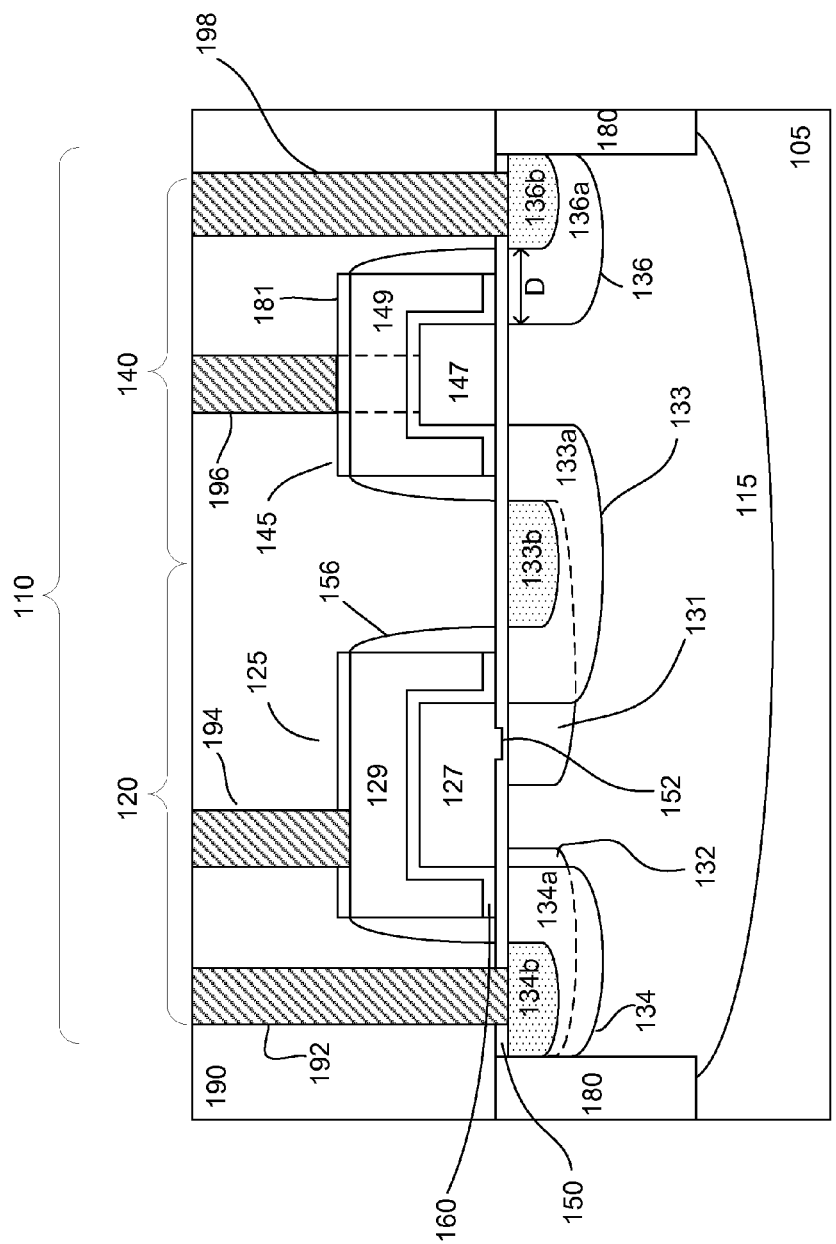

FIG. 1*c* shows a cross-sectional view of another embodiment of a memory cell 100. As shown, the memory cell 100 is similar to that described in FIG. 1*b* except that the fourth contact 196 is coupled to only the first sub-gate 147 of the second gate 145. This results in the second sub-gate 149 of the second gate being floated.

Figure 1D:
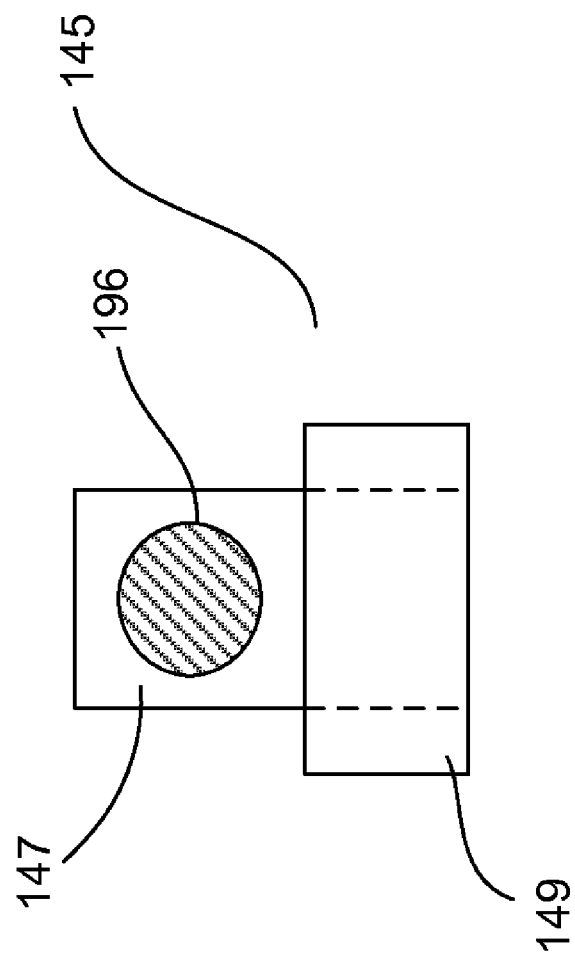
FIG. 1d shows a top view of a portion of the memory cell of FIG. 1c.

In one embodiment, floating of the second sub-gate can be achieved by patterning or removing a portion of the second sub-gate outside of the active area to expose a portion of the first sub-gate, as shown in FIG. 1*d*. For example, a portion of the second sub-gate adjacent to the channel and doped regions is removed. Other techniques or configurations to float the second sub-gate may also be employed.

Figure 2D:
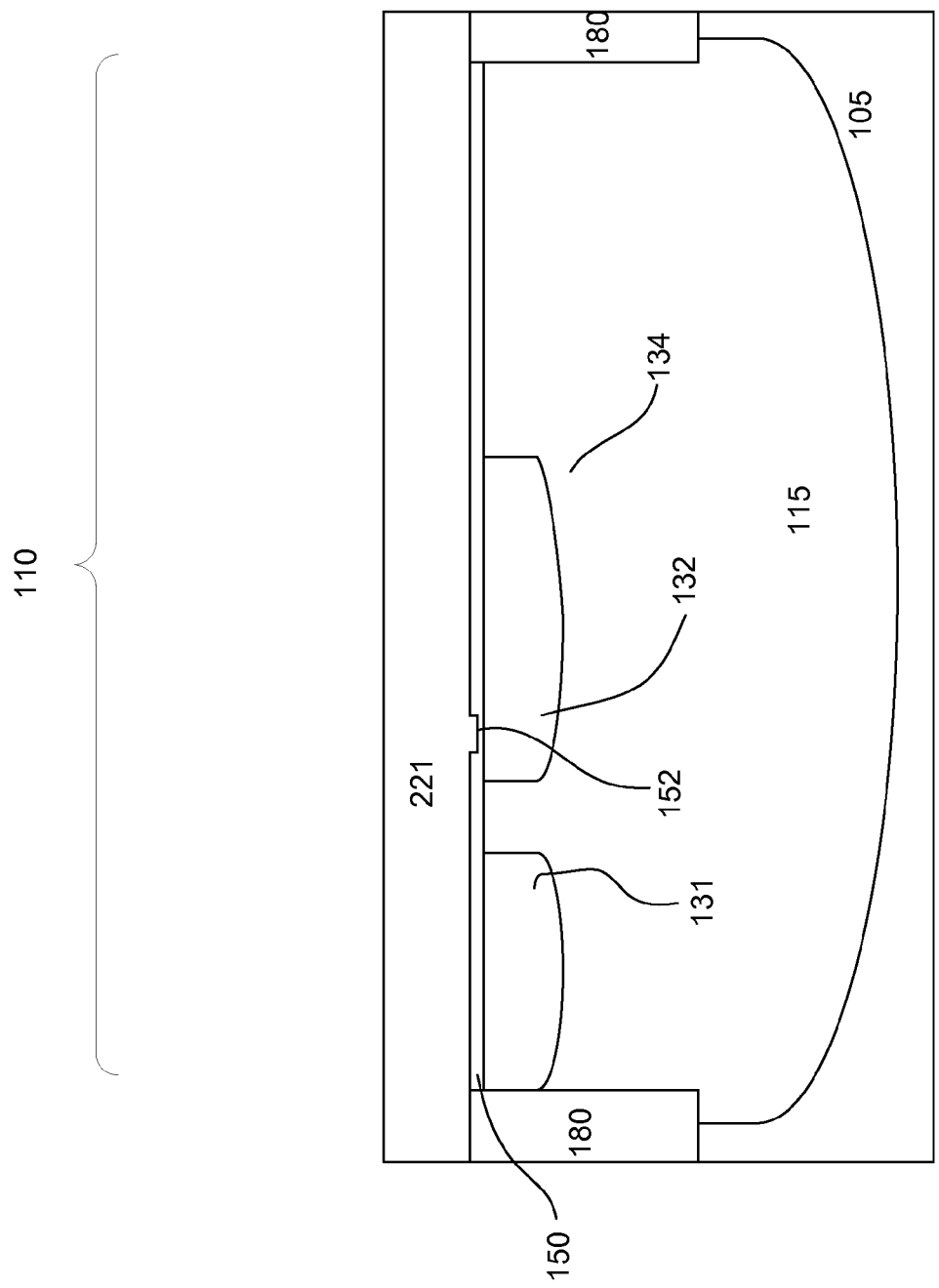

FIGS. 2*a-g* show cross-sectional views of an embodiment of a process 200 for forming a device or IC. Referring to FIG. 2*a*, a substrate 105 is provided. The substrate can comprise a silicon substrate, such as a lightly p-type doped substrate. Other types of substrates, including silicon germanium or silicon-on-insulator (SOI), are also useful.

As shown in FIG. 2*a*, a memory cell region 110 of the device is shown. However, it is understood that the substrate may include various types of regions (not shown). For example, the substrate may include other cell regions of an array region in which memory cells are formed and logic regions in which logic devices are formed. The logic regions, for example, may include regions for devices, such as support devices for accessing the memory array. Additionally, the logic regions may include other types of devices, depending on the type of IC formed. The logic region, for example, may include regions for different voltage devices. For example, the logic region may include regions for high voltage devices, medium voltage devices and low voltage devices. Other configurations of logic regions may also be useful.

The cell region is separated from other regions by isolation regions 180. The isolation regions comprise, for example, STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of doped wells. Other processes or materials can also be used to form the STIs. In other embodiments, the isolation may be other types of isolation regions. The depth of the STIs may be, for example, about 3000-4500 Å. Other depths for the STIs may also be useful.

A doped well 115 is formed in the cell region. The doped well, in one embodiment, comprises dopants of a second polarity type. The depth of the doped well, for example, may be about 10000-25000 Å. Providing doped wells of other depths may also be useful. The doped well of the second polarity dopants is used to form first polarity type devices. In one embodiment, the doped well comprises a p-type doped well to form n-type devices. Alternatively, the doped well comprises an n-type doped well to form p-type devices. The doped well may be formed by implanting appropriate dopants with the desired dose and power into the substrate. The dopant type, dose and power may depend on the type of device to be formed.

In one embodiment, the doped well comprises a p-well. The doped well may be formed by performing a chain of 3 implants at different energies. For example, a first boron (B) implant is performed at a dose about E12 cm$^{-2}$ at an energy level about 400 keV, a second B implant is performed at a dose about E12 cm$^{-2}$ at an energy level about 150 keV and at a third B implant is performed at a dose about E12 cm$^{-2}$ at an energy level about 20 keV. Other techniques for forming the doped well may also be employed.

The substrate may include other types of device regions for supporting other types of devices. For example, the substrate may include p-type and n-type devices, such as high, medium and low voltage p-type and n-type devices. Various types of n-type and p-type wells are provided for these devices. The various wells may be formed by separate implantation processes using implant masks. P-type dopants can include boron (B), aluminum (Al), indium (In) or a combination thereof, while n-type dopants can include phosphorus (P), arsenic (As), antimony (Sb) or a combination thereof.

In FIG. 2*b*, the cell region is prepared with first and second buried doped regions 131 and 132. The buried doped regions comprise dopants of the first polarity type. For example, the buried doped regions comprise n-type dopants to form an n-type memory cell. The buried doped region serves as a supply of charge for the control gate of the memory cell. In one embodiment, the buried doped regions are formed by ion implantation. For example, arsenic (As) is implanted at a dose about 4E14-9E14 cm$^{-2}$ at an energy of about 15-60 keV. Forming the buried doped regions using other types of dopants or implant parameters may also be useful.

A dielectric layer 253 is formed on the surface of the substrate in the cell region. In one embodiment, the dielectric layer serves as the gate dielectric layer for the transistors of the cell. The dielectric layer, for example, comprises thermal silicon oxide. For example, the dielectric layer is formed by a wet oxidation followed by annealing the substrate in an oxidizing ambient. The thickness of the dielectric layer is formed to an intermediate thickness. The temperature of the wet oxidation can be, for example, about 750-900° C. The annealing can be, for example, performed at a temperature of about 1000° C. The thickness of the dielectric layer may be about 150-220 Å. Other types of gate dielectric materials or thicknesses may also be useful. For example, the gate dielectric material may comprise other types of gate dielectric materials and/or be formed by other types of processes, such as chemical vapor deposition (CVD).

The dielectric layer is patterned to form an opening 251, exposing the substrate. Patterning of the opening may be achieved using mask and etch techniques. For example, a mask, such as photoresist, may be selectively patterned to create an opening to expose portions of the dielectric layer. An anisotropic etch, such as a reactive ion etch (RIE), may be performed to remove exposed portions of the dielectric layer to expose the substrate. Other patterning techniques may also be used. For example, a wet etch using etchants such as BOE, HF or a combination thereof can be employed. In addition, a combination of RIE and wet etch can also be useful. Other techniques for forming the opening may also be useful.

As shown in FIG. 2*c*, a second dielectric layer 254 is formed in the cell region. The second dielectric layer comprises, in one embodiment, thermal silicon oxide. For example, the dielectric layer is formed by a wet oxidation at a temperature of about 750-850° C. The annealing may be performed after the wet oxidation. The annealing can be, for example, performed at a temperature of about 900-1000° C. The thickness of the second dielectric layer may be about 60-90 Å. Other types of gate dielectric materials or thicknesses may also be useful. For example, the gate dielectric material may comprise other types of gate dielectric materials and/or be formed by other types of processes, such as chemical vapor deposition (CVD). For example, the dielectric material may be nitrided oxide of ISSG oxide.

The second dielectric layer fills the opening 251 and forms over the dielectric layer 253. The dielectric layers form gate dielectric layer 150 on the surface of the substrate. A tunneling window 152 is formed in the first transistor region which has a thickness equal to about the thickness of the second dielectric layer.

Referring to FIG. 2d, a first sub-gate electrode layer 221 is formed on the substrate over the gate dielectric layer. The first sub-gate layer comprises, in one embodiment, polysilicon. The first sub-gate electrode layer can be formed as an amorphous or non-amorphous layer. The first sub-gate electrode may be doped. Various techniques may be employed to dope the first sub-gate electrode, for example, in situ doping or ion implantation. Providing an undoped first sub-gate electrode layer may also be useful. Other types of gate electrode materials may also be useful. The thickness of the first sub-gate electrode layer may be about 800-3000 Å. Other thicknesses may also be useful. To form the first sub-gate electrode layer, techniques such as chemical vapor deposition (CVD), can be used. Other techniques may also be useful.

Figure 2E:
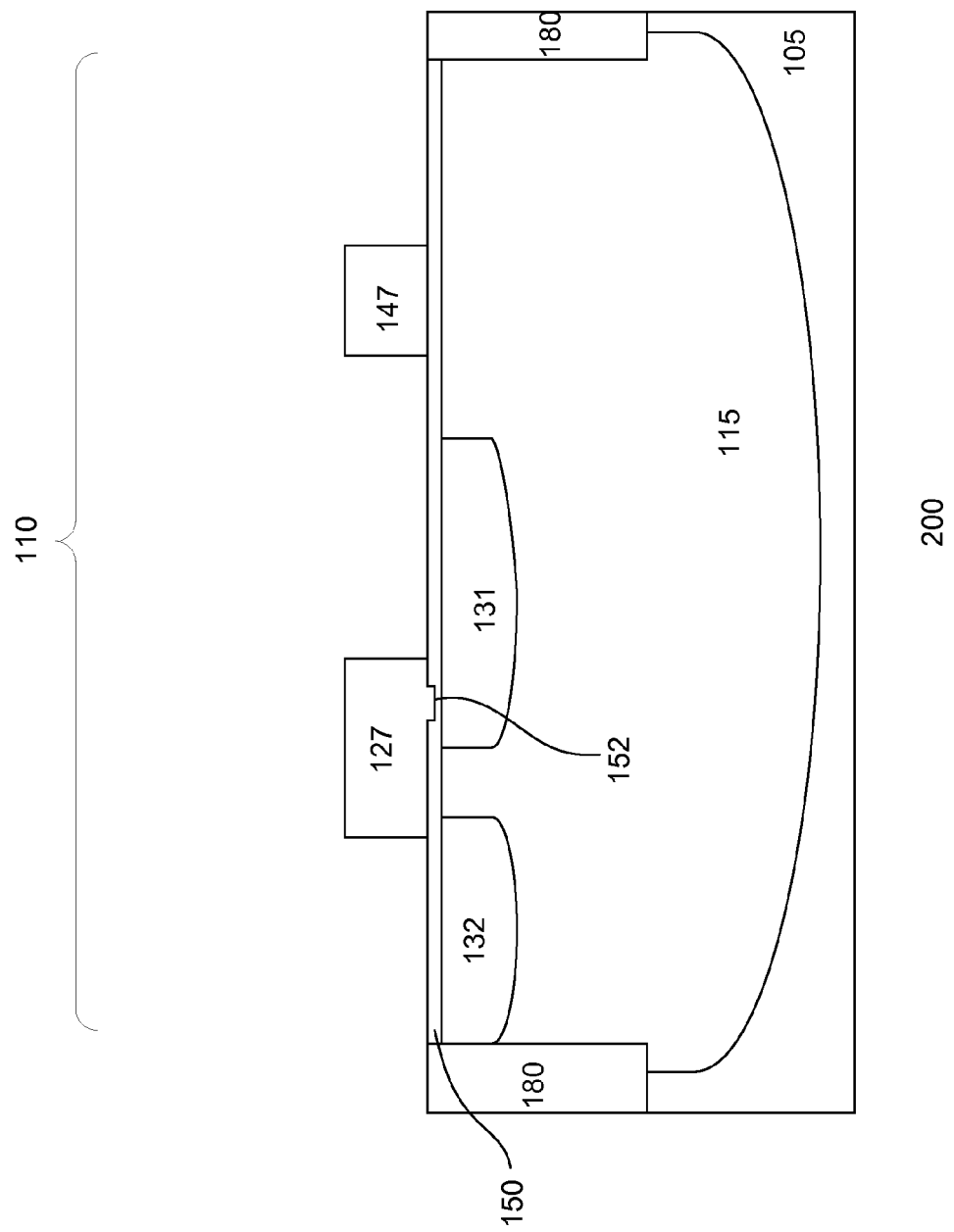

In FIG. 2e, the first sub-gate layer is patterned. In one embodiment, the first sub-gate layer is patterned to form first sub-gates 127 and 147 of the first and second transistors of the cell. Techniques, such as mask and etch, can be used. For example, a photoresist layer is formed over the gate layers and patterned, exposing portions of the first sub-gate layer. An anisotropic etch, such as a RIE, is performed to remove exposed portions of the first sub-gate layer. To improve lithographic resolution, an anti-reflective coating (ARC) can be provided beneath the photoresist. Other techniques for patterning the first sub-gate layer may also be useful. For example, a hard mask may be used to pattern the first sub-gate layer.

Referring to FIG. 2f, first and second doped regions 133, 134 and 136 of the first and second transistors are formed. The doped regions can be formed by implanting first type dopants into the substrate. In one embodiment, the doped regions can be self-aligned using the first sub-gates and isolation regions as implant masks. In one embodiment, the first sub-portions 133a, 134a and 136a of the first and second doped regions of the first and second transistors are formed. In one embodiment, the first sub-portions are formed by ion implantation at a dose about E13 cm$^{-2}$ at an energy level about 25-80 keV. The implant may be performed with a tilt angle. The tilt angle may be, for example, up to about 45°. Performing the implant at other tilt angles, including performing un-tilted implants (e.g., at 0°), may also be useful. In the case of an n-type device, Ph dopants may be implanted. Other types of dopants or implant parameters may also be useful. As shown, a common first doped region is provided for the first and second transistors.

Figure 2G:
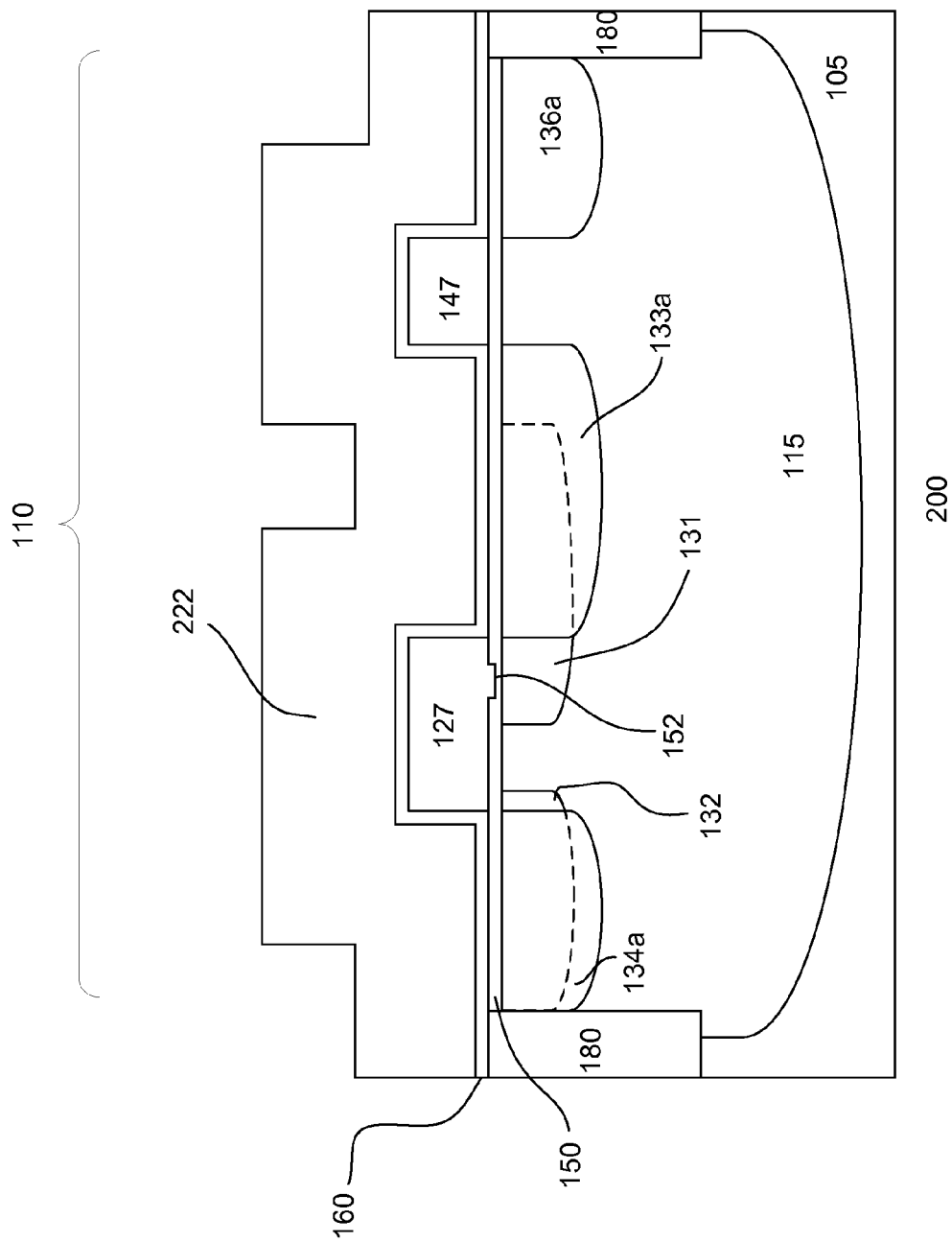

In FIG. 2g, an intergate dielectric layer 160 is formed on the substrate. The intergate dielectric layer covers the first sub-gates and substrate, such as the gate dielectric layer 150. In one embodiment, the intergate dielectric layer comprises a dielectric stack, such as an ONO stack. Other types of intergate dielectric and dielectric stacks may also be useful. The ONO stack comprises, for example, a bottom oxide layer, a nitride layer and a top oxide layer. Various techniques may be employed to form the dielectric stack. For example, the different layers of the dielectric stack may be formed by LPCVD. Other techniques may also be useful. Such techniques, for example, may be described in concurrently filed U.S. patent application Ser. No. 12/888,434, titled "Dielectric Stacks"; filed Sep. 23, 2010), which is already herein incorporated by reference for all purposes.

A second sub-gate electrode layer 222 is deposited on the substrate, covering the intergate dielectric layer. The second sub-gate layer, in one embodiment, comprises polysilicon. The second sub-gate electrode layer can be formed as an amorphous or non-amorphous layer. The second sub-gate electrode layer can be doped or undoped. Other types of gate electrode materials are also useful. The thickness of the second sub-gate electrode layer is, for example, about 800-2500 Å. Other thicknesses are also useful. To form the second sub-gate electrode layer, techniques, such as chemical vapor deposition (CVD), can be used. Other techniques are also useful.

Figure 2H:
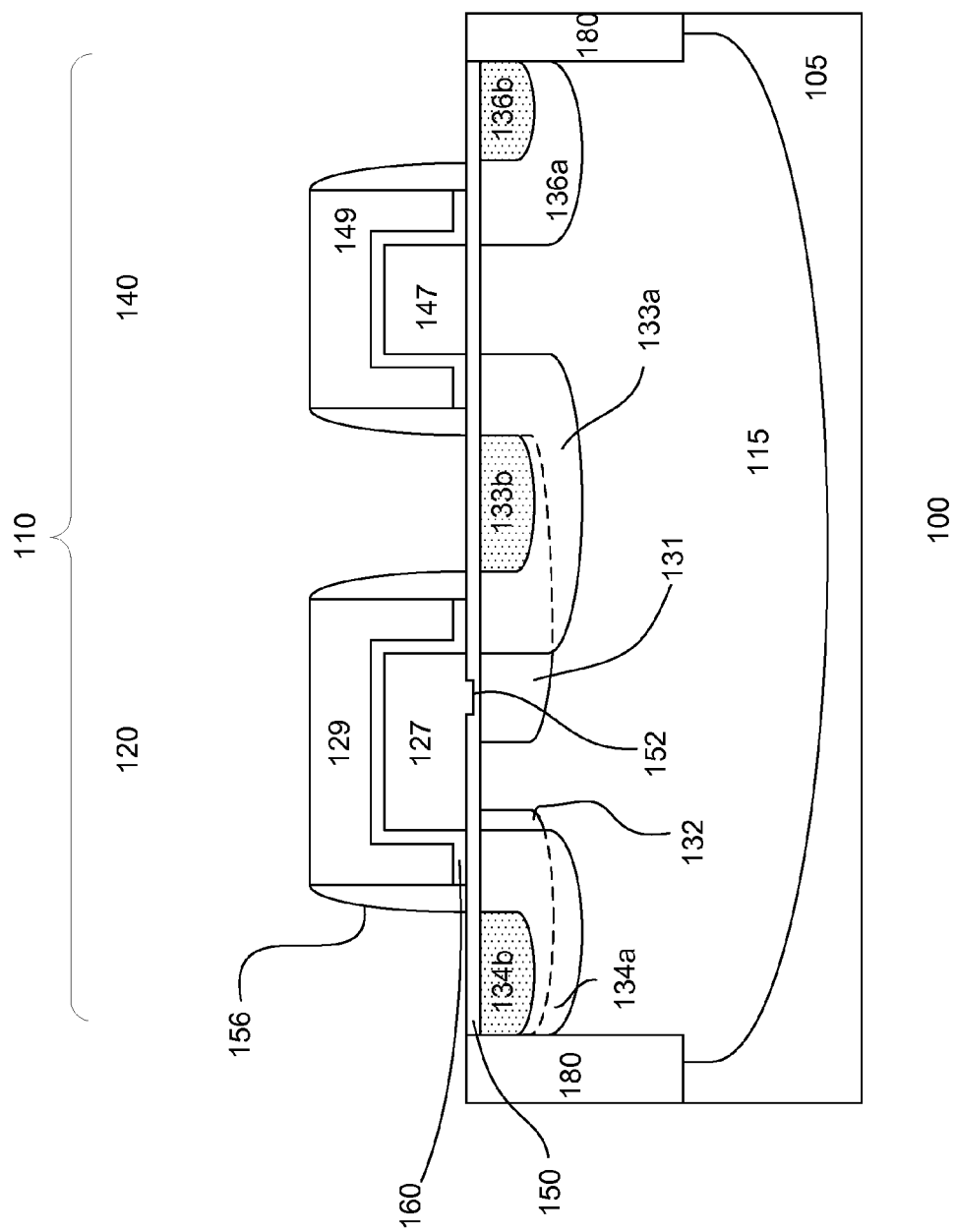

Referring to FIG. 2h, the substrate is patterned to form first and second gates of the first and second transistors 120 and 140 of the memory cell. For example, the second sub-gate layer and intergate dielectric layer are patterned to form first and second gates of the first and second transistors. In one embodiment, the second sub-gate wraps around the first sub-gate. The amount that the second sub-gates wrap around the first sub-gate may depend on the distance D selected to improve junction breakdown performance. The distance D, for example, may be about 0.1-0.2 um. Other values of D may also be useful. For example, the distance D depends on the desired bitline junction breakdown performance. Techniques, such as mask and etch, can be used to form the dual gate stacks. For example, a photoresist layer is formed over the gate layers and patterned, exposing portions of the second sub-gate layer. An anisotropic etch, such as a RIE, is performed to remove exposed portions of the second sub-gate layer. To improve lithographic resolution, an anti-reflective coating (ARC) can be provided beneath the photoresist. Other techniques for patterning the first second-gate layer may also be useful. For example, a hard mask may be used to pattern the second sub-gate layer.

The process continues to form the device. For example, the additional processing can include removing of the mask layer and the dielectric layers and forming of the gate sidewall spacers 156. The gate sidewall spacers, for example, comprise nitride. Other types of spacer materials may also be useful. To form sidewall spacers, a spacer dielectric layer is deposited on the substrate. The spacers can be formed by using various techniques, such as plasma enhanced chemical vapor deposition (PECVD). Other techniques to form the spacer dielectric layer may also be useful. The spacer dielectric layer is subsequently anisotropically etched, such as by RIE, to remove horizontal portions, leaving non-horizontal portions on the sidewalls as the spacers. In one embodiment, the additional processing also includes silicide contacts such as Co-silicide, W-silicide, Ti-silicide, Ni-silicide or a combination thereof are formed on the surface of the substrate in the S/D regions and the surface of the gate electrode. Other materials of silicide contacts may also be useful. The silicide contacts may also be formed in other parts of the device.

The process further continues to form the second sub-portions of doped regions of the transistors, PMD layer, and contacts to the terminals of the cell. Additional processes may include forming of one or more interconnect levels, final passivation, dicing, assembly and packaging. Other processes are also useful. For example, other components, such as low voltage, medium voltage, and high voltage I/O devices can be formed prior to forming the interconnections. The memory cells can be formed as a memory device or embedded into a part of ICs.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method of forming a device comprising:
providing a substrate prepared with a cell area separated by other active areas by isolation regions;
forming first and second gates of first and second transistors in the cell area, wherein
the first gate includes first and second sub-gates separated by a first intergate dielectric layer, and
the second gate includes a second sub-gate surrounding a first sub-gate, the first and second sub-gates of the second gate are separated by a second intergate dielectric layer;
forming first and second junctions of the first and second transistors;
forming a first gate terminal coupled to the second sub-gate of the first transistor; and
forming a second gate terminal coupled to at least the first sub-gate of the second transistor.

2. The method of claim 1 comprises:
forming a first cell terminal coupled to the first junction of the first transistor; and
forming a second cell terminal coupled to the first junction of the second transistor.

3. The method of claim 2 wherein:
the first transistor serves as a control gate;
the second transistor serves as a select gate;
the second cell terminal serves as a bitline; and
the second gate terminal serves as a wordline.

4. The method of claim 1 wherein forming the second junctions of the first and second transistors comprises forming a common second junction of the first and second transistors.

5. The method of claim 1 wherein:
the first transistor serves as a control gate;
the second transistor serves as a select gate;
a second cell terminal coupled to the second transistor serves as a bitline; and
the second gate terminal serves as a wordline.

6. The method of claim 1 wherein forming the first and second gates comprises:
forming a first sub-gate layer on the substrate;
patterning the first sub-gate layer to form first sub-gates of the first and second gates;
forming a common intergate dielectric layer on the substrate covering the first sub-gates, the common intergate dielectric layer serves as the first and second intergate dielectric layers of the first and second gates;
forming a second sub-gate layer on the substrate over the common intergate dielectric layer; and
patterning the second sub-gate layer to form first and second gates, wherein the second sub-gates of the first and second gates wrap around the first sub-gates of the first and second gates.

7. The method of claim 6 wherein:
the first and second junctions of the first and second transistors include a heavily doped portion and a lightly doped extension portion extending from the first gate to the second gate; and
comprises
forming the lightly doped extension portion of the first and second junctions after forming the first sub-gates of the first and second gates, and
forming the heavily doped portion of the first and second junctions after forming the second sub-gates of the first and second gates.

8. The method of claim 7 wherein the second sub-gate surrounding the first sub-gate of the second gate increases the distance from an edge of the first sub-gate to the heavily doped portion of the first junction to reduce junction leakage.

9. The method of claim 6 wherein patterning the second sub-gate layer also forms gates of other transistors in the device.

10. The method of claim 1 comprises forming a gate dielectric layer on the substrate prior to forming the first sub-gate layer, wherein the gate dielectric layer includes a tunneling window under the first sub-gate of the first gate.

11. The method of claim 10 wherein forming the gate dielectric layer comprises:
forming a first gate dielectric layer on the substrate;
patterning the first gate dielectric layer to form an opening corresponding to the tunneling window; and
forming a second gate dielectric layer over the first gate dielectric layer and covering the opening to form the tunneling window.

12. The method of claim 11 wherein the second gate dielectric layer also serves as gate dielectric layer of other transistors in the device.

13. The method of claim 1 wherein the intergate dielectric layer comprises an oxide-nitride-oxide stack.

14. The method of claim 1 wherein the first intergate dielectric layer comprises multiple dielectric layers.

15. The method of claim 1 wherein the second gate terminal is coupled to the first and second sub-gates of the second gate.

16. The method of claim 1 wherein the second gate terminal is coupled to the first sub-gate of the second gate while the second sub-gate of the second gate is floated.

17. A method of forming a device comprising:
providing a substrate prepared with a cell area;
forming first and second gates of first and second transistors in the cell area, wherein
the first gate includes first and second sub-gates separated by a first intergate dielectric layer, and
the second gate includes a second sub-gate surrounding a first sub-gate, the first and second sub-gates of the second gate are separated by a second intergate dielectric layer;
forming first and second junctions of the first and second transistors;
forming a first gate terminal coupled to the second sub-gate of the first transistor; and
forming a second gate terminal coupled to at least the first sub-gate of the second transistor.

18. The method of claim 17 wherein the second sub-gate surrounding the first sub-gate of the second gate increases the distance from an edge of the first sub-gate to the heavily doped portion of the first junction to reduce junction leakage.

19. The method of claim 17 wherein:
the first and second junctions of the first and second transistors include a heavily doped portion and a lightly doped extension portion extending from the first gate to the second gate.

20. The method of claim 19 comprises:
forming the lightly doped extension portion of the first and second junctions after forming the first sub-gates of the first and second gates, and
forming the heavily doped portion of the first and second junctions after forming the second sub-gates of the first and second gates.

21. The method of claim 20 comprises:
forming first and second buried doped regions adjacent to the first gate of the first transistor.

22. The method of claim 21 wherein the buried doped regions overlap the heavily doped portion and the lightly doped extension portion of the first gate and extend beneath the first gate.

23. The method of claim 17 wherein forming the second junctions of the first and second transistors comprises forming a common second junction of the first and second transistors.

24. The method of claim 17 wherein forming the first and second gates comprises:
forming a first sub-gate layer on the substrate;
patterning the first sub-gate layer to form first sub-gates of the first and second gates;
forming a common intergate dielectric layer on the substrate covering the first sub-gates, the common intergate dielectric layer serves as the first and second intergate dielectric layers of the first and second gates;
forming a second sub-gate layer on the substrate over the common intergate dielectric layer; and
patterning the second sub-gate layer to form first and second gates, wherein the second sub-gates of the first and second gates wrap around the first sub-gates of the first and second gates.

25. The method of claim 17 comprises forming a gate dielectric layer on the substrate prior to forming the first sub-gate layer, wherein the gate dielectric layer includes a tunneling window under the first sub-gate of the first gate.

* * * * *